(12) United States Patent
Yamauchi et al.

(10) Patent No.: US 8,587,553 B2
(45) Date of Patent: Nov. 19, 2013

(54) CAPACITANCE CHANGE DETECTION CIRCUIT, TOUCH PANEL AND DETERMINATION METHOD

(75) Inventors: Kazuto Yamauchi, Okazaki (JP); Yasunori Murayama, Ichinomiya (JP); Sadahiko Tanaka, Okazaki (JP); Keitaro Takizawa, Okazaki (JP); Kouichi Yamanoue, Yokohama (JP)

(73) Assignees: Mitsubishi Jidosha Kogyo Kabushiki Kaisha, Tokyo (JP); Visteon Japan, Ltd., Yokohama-Shi (JP)

( * ) Notice: Subject to any disclaimer, the term of this patent is extended or adjusted under 35 U.S.C. 154(b) by 524 days.

(21) Appl. No.: 12/680,390

(22) PCT Filed: Oct. 8, 2008

(86) PCT No.: PCT/JP2008/068300
§ 371 (c)(1),
(2), (4) Date: Mar. 26, 2010

(87) PCT Pub. No.: WO2009/048077
PCT Pub. Date: Apr. 16, 2009

(65) Prior Publication Data
US 2010/0230180 A1    Sep. 16, 2010

(30) Foreign Application Priority Data
Oct. 10, 2007 (JP) ................. 2007-264112

(51) Int. Cl.
*G06F 3/045* (2006.01)
*G06F 3/044* (2006.01)
(52) U.S. Cl.
USPC ....................... 345/174; 178/18.06
(58) Field of Classification Search
USPC ....................... 345/174; 178/18.06
See application file for complete search history.

(56) References Cited

U.S. PATENT DOCUMENTS

| 6,191,828 | B1 * | 2/2001 | Kim et al. ................. 349/12 |
| 7,812,827 | B2 * | 10/2010 | Hotelling et al. ........... 345/173 |
| 2005/0001633 | A1 | 1/2005 | Okushima et al. |
| 2007/0257890 | A1 * | 11/2007 | Hotelling et al. ........... 345/173 |

FOREIGN PATENT DOCUMENTS

| EP | 0 568 342 A1 | 11/1993 |
| JP | 62-9423 A | 1/1987 |
| JP | 7-307657 A | 11/1995 |
| JP | 2000-295183 A | 10/2000 |
| JP | 2003-46383 A | 2/2003 |
| JP | 2004-206288 A | 7/2004 |
| JP | 2004-340662 A | 12/2004 |

* cited by examiner

*Primary Examiner* — Amr Awad
*Assistant Examiner* — Randal Willis
(74) *Attorney, Agent, or Firm* — Birch, Stewart, Kolasch & Birch, LLP (57) ABSTRACT

A detection circuit 1 includes: an input unit 2; two contact electrodes A and B which are connected to the input unit; phase inversion unit 3 connected to the contact electrode A; one amplification unit 41 arranged in each contact unit; and detection units 5A and 5B which detect as an electric change amount, an amplitude change of an input signal caused by a capacitance change in each of the contact electrodes A and B. The detection circuit 1 causes the two electrodes to input signals having phases shifted by a half period from each other by using the phase inversion unit 3. In the presence of contact, the amplitude of the input pulses is amplified by the one amplification unit 41. The respective detection units 5A and 5B detect signals of respective electrodes from the one amplified signal and output them to output units 6A and 6B, respectively.

11 Claims, 3 Drawing Sheets

CAPACITANCE CHANGE DETECTION CIRCUIT, TOUCH PANEL AND DETERMINATION METHOD

BACKGROUND OF THE INVENTION

1. Field of the Invention

This invention relates to a Capacitance change detection circuit, a touch panel, and a determination method 2. Description of the Related Art In recent years, touch panels used in various industrial equipment use touch sensors which detect which part of the touch panel a human has touched or contacted. When the human touches an electrode on the panel, the same state as a state in which a capacitor having electrostatic capacity equivalent to that of the human body is connected to the electrode is achieved. Utilizing this phenomenon, the touch sensor detects a change in electrostatic capacity formed between this electrode and ground (earth) as electric capacity, and determines whether or not there has been a touch or contact.

As such a touch sensor, one having a contact electrode exposed to the outside and an oscillator circuit connected to the contact electrode has been known (see Patent Document 1). With this touch sensor, when the human is out of contact with the contact electrode, the oscillator circuit performs steady oscillation. The touch sensor sets such an oscillation stop point that when the human contacts the contact electrode and the equivalent impedance of the human body exceeds a reference value specific to the circuit, the steady oscillation is stopped. The touch sensor also sets such an oscillation start point that when the human contacts the contact electrode and the equivalent impedance of an object to be detected exceeds a reference value specific to the circuit, oscillation is started. In this manner, the touch sensor outputs the states of contact and separation of the human body according to the presence and absence of steady oscillation.

As another touch sensor, one having a detection electrode in addition to the contact electrode and adapted to detect a capacitance difference between these electrodes has been known (see Patent Document 2). This touch sensor is equipped with a sensor case comprising an insulating material; a detection electrode disposed on the inner surface of the sensor case; a touch electrode disposed at a position on the outer surface of the sensor case, the position opposing the detection electrode, the touch electrode being capacitively coupled to the detection electrode; and a detection circuit connected to the detection electrode for detecting the contact of an object with the touch electrode based on a change in the electrostatic capacity between the detection electrode and ground and outputting a detection signal.

Patent Document 1: JP-A-2003-46383 (see claim 1 and FIG. 2)

Patent Document 2: JP-A-2004-340662 (see claim 1 and FIG. 1)

SUMMARY OF THE INVENTION

Problems to be Solved by the Invention

With the above-mentioned circuits, it has been necessary to use many circuit elements for the construction of the oscillator circuit. Thus, they have been costly, and have posed the problem that as the number of the electrodes increases, integration becomes difficult.

In the case of the circuit having the contact electrode and the detection electrode, in particular, there has been the problem that an erroneous reaction occurs owing to a dielectric substance adhering between the contact electrode and the detection electrode.

The challenge to the present invention is to solve the above-described problems of the conventional technologies. It is an object of the present invention to provide a capacitance change detection circuit having a small number of circuit elements, being capable of integration, and involving few erroneous reactions, and also to provide a touch panel using this capacitance change detection circuit. It is another object of the present invention to provide a determination method using this capacitance change detection circuit.

Means for Solving the Problems

A capacitance change detection circuit according to the present invention comprises: at least one set of contact electrodes including a set of a first contact electrode supplied with a pulse signal from an input unit for the pulse signal via phase inversion means, and a second contact electrode supplied with the pulse signal from the input unit; one amplification means connected to the one set of contact electrodes; first detection means for detecting a signal showing a state of the first contact electrode; second detection means for detecting a signal showing a state of the second contact electrode; and output units connected to the first detection means and the second detection means, respectively.

The capacitance change detection circuit of the present invention is of a very simple configuration in which the one amplification means and the two detection means are provided for the one set of contact electrodes, and the number of elements or devices can be reduced. This configuration has become possible by providing the phase inversion means, and supplying the first contact electrode with the signal of the phase opposite to the phase of the signal of the second contact electrode. That is, the signals showing the states of the two electrodes are of the phases opposite to each other. Even when these signals are combined and the resulting composite signal is amplified by the one amplification means, therefore, the first detection means counteracts the signal showing the state of the second contact electrode of the phase opposite to the phase of the signal showing the state of the first contact electrode, and detects only the signal showing the state of the first contact electrode, whereas the second detection means counteracts the signal showing the state of the first contact electrode of the phase opposite to the phase of the signal showing the state of the second contact electrode, and detects only the signal showing the state of the second contact electrode. As a result, the capacitance change detection circuit of the present invention is configured such that the one amplification means and the two detection means can detect the respective signals for the one set of contact electrodes. Further, the capacitance change detection circuit of the present invention uses only the contact electrodes as the electrodes, thereby decreasing erroneous reactions.

In the capacitance change detection circuit, preferably, the amplification means comprises an inverter, a capacitor provided on the input side of the inverter, and a resistor in parallel with the inverter; the output side of the inverter is connected to the input sides of the detection means; and the inverter and the resistor constitute a negative feedback inverting amplification circuit. Since the amplification means is composed of the capacitor, the inverter, and the resistor, it is possible to form the circuit in a simple configuration and at a reduced cost.

Preferably, the phase inversion means is an inverter. Since the phase inversion means is composed of the inverter, it is possible to form the circuit in a simple configuration and at a reduced cost.

Preferably, each of the first and second detection means comprises a diode, a resistor, and a capacitor; the diode of the first detection means has a cathode side connected to a first connection point supplied with the pulse signal from the phase inversion means, and has an anode side connected to a second connection point provided between an output side of the amplification means and the resistor of the first detection means; the diode of the second detection means has a cathode side connected to a third connection point supplied with the pulse signal from the input unit, and has an anode side connected to a fourth connection point provided between the output side of the amplification means and the resistor of the second detection means; and the resistor and the capacitor of each detection means constitute a smoothing circuit. If the first detection means is configured in this manner, the signal supplied to the second connection point via the diode, which is the same signal as the signal supplied to the first contact electrode, is of the phase opposite to the phase of the signal showing the state of the second contact electrode. At the second connection point, therefore, this signal cancels the signal showing the state of the second contact electrode from the signal outputted from the amplification means. As a result, only the signal in the first contact electrode can be detected. If the second detection means is configured in the above manner, moreover, the signal showing the state of the first contact electrode is canceled out, at the fourth connection point, by the signal supplied to the fourth connection point via the diode which is the same signal as the signal inputted to the second contact electrode. As a result, only the signal in the second contact electrode can be detected.

It is preferred that the first resistor provided between the phase inversion means and the first contact electrode, and the second resistor provided between the input unit and the second contact electrode be of the same resistance value. Since the same resistance value is set for these resistors, the present capacitance change detection circuit can be constructed in a more simplified manner.

It is preferred that the third resistor be provided between the first contact electrode and the amplification means, the fourth resistor be provided between the second contact electrode and the amplification means, and the third resistor and the fourth resistor have the same resistance value. It is also preferred that the first resistor, the second resistor, the third resistor, and the fourth resistor have the same resistance value. By setting these resistors to have the same resistance value, the present capacitance change detection circuit can be constructed more simply.

Preferably, the fifth resistor is provided between the amplification means and the first detection means, the sixth resistor is provided between the amplification means and the second detection means, and the fifth resistor and the sixth resistor have the same resistance value. Since the same resistance value is set for these resistors, the present capacitance change detection circuit can be constructed in a more simplified manner.

The touch panel of the present invention is a touch panel comprising the above-mentioned capacitance change detection circuit, a panel portion; and a control unit, the touch panel being characterized in that the contact electrodes of the capacitance change detection circuit are provided in the panel portion, and the output units of the capacitance change detection circuit are connected to the control unit. The present capacitance change detection circuit is of a simple configuration, has a smaller number of devices or elements, and facilitates integration. Thus, the use of the present capacitance change detection circuit makes it possible to construct a multi-input touch panel.

The determination method of the present invention is a determination method for determining whether or not there is contact with a contact electrode, by use of the above capacitance change detection circuit, the method comprising: detecting a signal showing a difference between a signal showing the state of a first contact electrode and a signal showing the state of a second contact electrode; and determining, based on the signal showing the difference, whether or not there is contact with any of the contact electrodes. According to such a determination method, the presence or absence of contact with the contact electrode can be determined in a simplified manner.

Effects of the Invention

The capacitance change detection circuit of the present invention exhibits the excellent effects that the number of the devices or elements can be reduced, its configuration is simple, and few malfunctions are involved. The touch panel of the present invention exhibits the excellent effect that a multi-input touch panel can be constructed easily. The determination method of the present invention exhibits the excellent effect that whether or not there is contact with the contact electrode can be determined accurately.

BRIEF DESCRIPTION OF THE DRAWINGS

FIGS. 1(*a*), 1(*b*) are block diagrams for illustrating the capacitance change detection circuit of the present invention.

FIGS. 3(*a*) to 3(*j*) are graphs for illustrating the actions of the circuit shown in FIG. 2.

DESCRIPTION OF REFERENCE NUMERALS

1 Capacitance change detection circuit
2 Input unit
3 Phase inversion means
41 Amplification means
5A, 5B Detection means
6A, 6B Output means

DETAILED DESCRIPTION OF THE INVENTION

The capacitance change detection circuit of the present invention will be described using FIGS. 1(*a*), 1(*b*).

Figure 1:
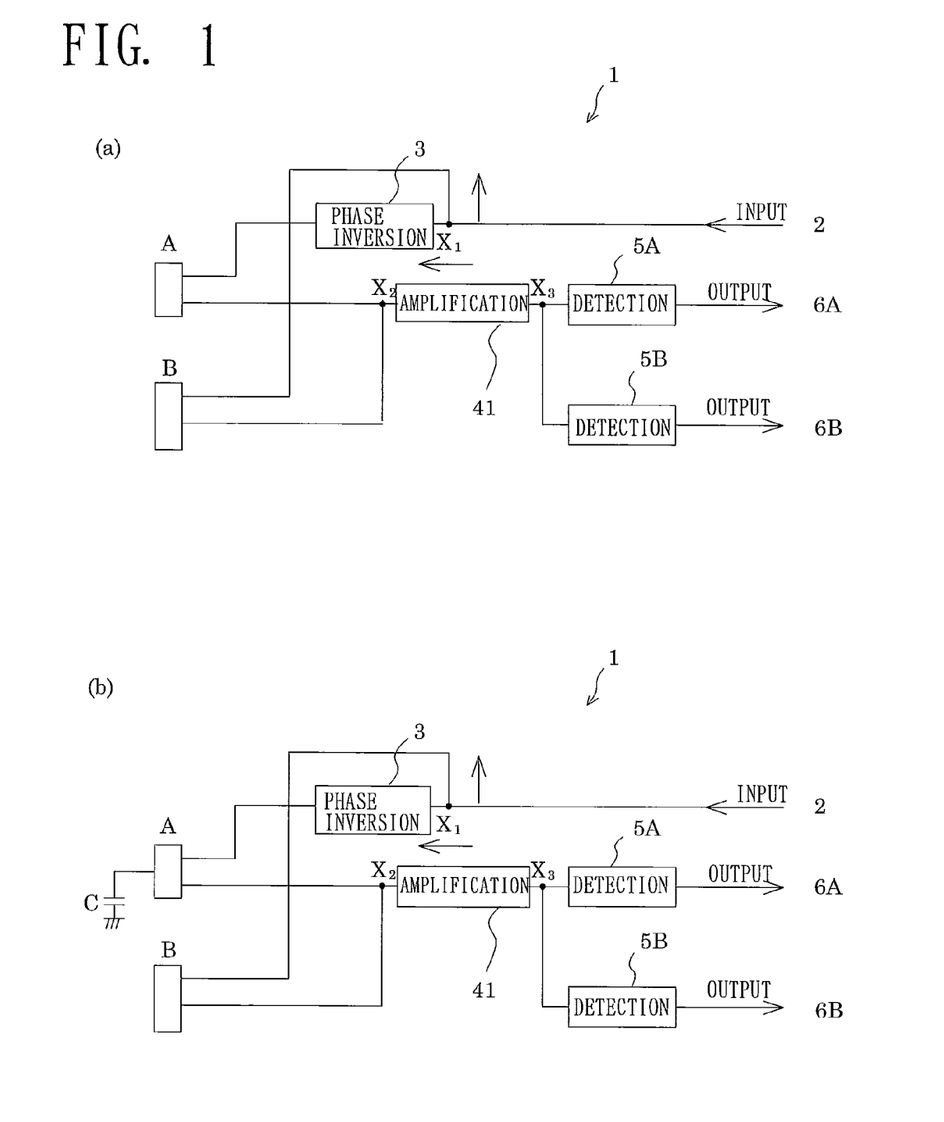

FIGS. 1(*a*) and 1(*b*) are block diagrams for illustrating the capacitance change detection circuit of the present invention. A capacitance change detection circuit 1 (may hereinafter be referred to simply as a detection circuit 1) according to the present invention is equipped with a set of contact electrodes (may hereinafter be referred to simply as electrodes) A and B. The detection circuit 1 is also equipped with one input unit 2 for inputting an input signal; one phase inversion means 3 for inverting the phase of the signal (delaying the phase by a half period); an amplification means 41 for amplifying the amplitude of the inputted signal; a detection means 5A for detecting a signal showing the state of the electrode A from the inputted signal; a detection means 5B for detecting a signal showing the state of the electrode B from the inputted signal; and output units 6A, 6B.

In the detection circuit 1, the electrodes A and B are exposed at the surface of a touch panel, for example, and a human can touch or contact it. The input unit 2 is connected to the electrode A, and is also connected to the electrode B via a connection point $X_1$. The one phase inversion means 3 for inverting the phase of the signal is connected only between the electrode A and the connection point $X_1$. Also, the electrode A is connected to the input side of the amplification means 41. The electrode B is also connected to the input side of the amplification means 41 via a connection point $X_2$ between the electrode A and the amplification means 41. This amplification means 41 is connected on its output side to the input sides of the two detection means 5A and 5B via a connection point $X_3$. Further, the respective detection means 5A, 5B are connected on their output sides to the respective output units 6A, 6B.

That is, the detection circuit 1 of the present invention is of a very simple configuration in which the one amplification means and the two detection means are provided for the one set of electrodes.

With the above detection circuit 1, as shown in FIG. 1(a), in the absence of human contact or touch, the input signal from the input unit is inputted to the electrode A via the phase inversion means 3, and is inputted to the electrode B directly, whereafter these inputted signals are combined at the connection point $X_2$. In this case, the signal supplied to the electrode A and the signal supplied to the electrode B are phase-shifted by a half period. Upon the combination at the connection point $X_2$, therefore, the amplitudes of the signals are canceled out to present a constant voltage. Even when this voltage is inputted to the amplification means 41, the amplification of the resulting composite signal is not amplified. This signal of the constant voltage is branched at the connection point $X_3$, and the resulting branched-off signals are inputted to the detection means 5A and 5B. The detection means 5A counteracts the signal showing the state of the electrode B of a phase opposite to the phase of the signal showing the state of the electrode A, detects only the signal showing the state of the electrode A, and outputs it to the output unit 6A (details will be described later). The detection means 5B counteracts the signal showing the state of the electrode A of a phase opposite to the phase of the signal showing the state of the electrode B, detects only the signal showing the state of the electrode B from the signal outputted from the amplification means 41, and outputs it to the output unit 6B (details will be described later). The respective output units 6A and 6B determine that no contact has been made.

When a human contacts or touches the electrode A, as shown in FIG. 1(b), the same state as the connection of a capacitor C to the electrode A is achieved, whereby the capacities at the electrodes A and B change. In this case, the input signal from the input unit 2 is inputted to the electrode A via the phase inversion means 3, and is inputted to the electrode B directly, whereafter these inputted signals are combined at the connection point $X_2$. Unlike the case of FIG. 1 (a) above, however, their amplitudes are not counterbalanced, so that the amplitude of the composite signal is amplified by the amplification means 41. Then, in the detection means 5A, only the signal showing the state of the electrode A is detected from the one amplified signal outputted from the amplification means 41, and outputted to the output unit 6A (details will be described later). In the detection means 5B, only the signal showing the state of the electrode B is detected from the one amplified signal, and outputted to the output unit 6B (details will be described later).

That is, the detection circuit 1 of the present invention is configured such that the signal of the phase opposite to the phase of the signal for the electrode B is inputted to the electrode A by the phase inversion means 3. Because of this configuration, at the detection means 5A, 5B, signals showing the states of the electrodes of opposite phases are canceled from the one composite signal, and only signals showing the states of the respective electrodes A and B of the same phase (signals related to capacitance changes) can be withdrawn. As a result, a simple configuration in which the one amplification means alone is provided for the set of electrodes can be realized.

Figure 2:
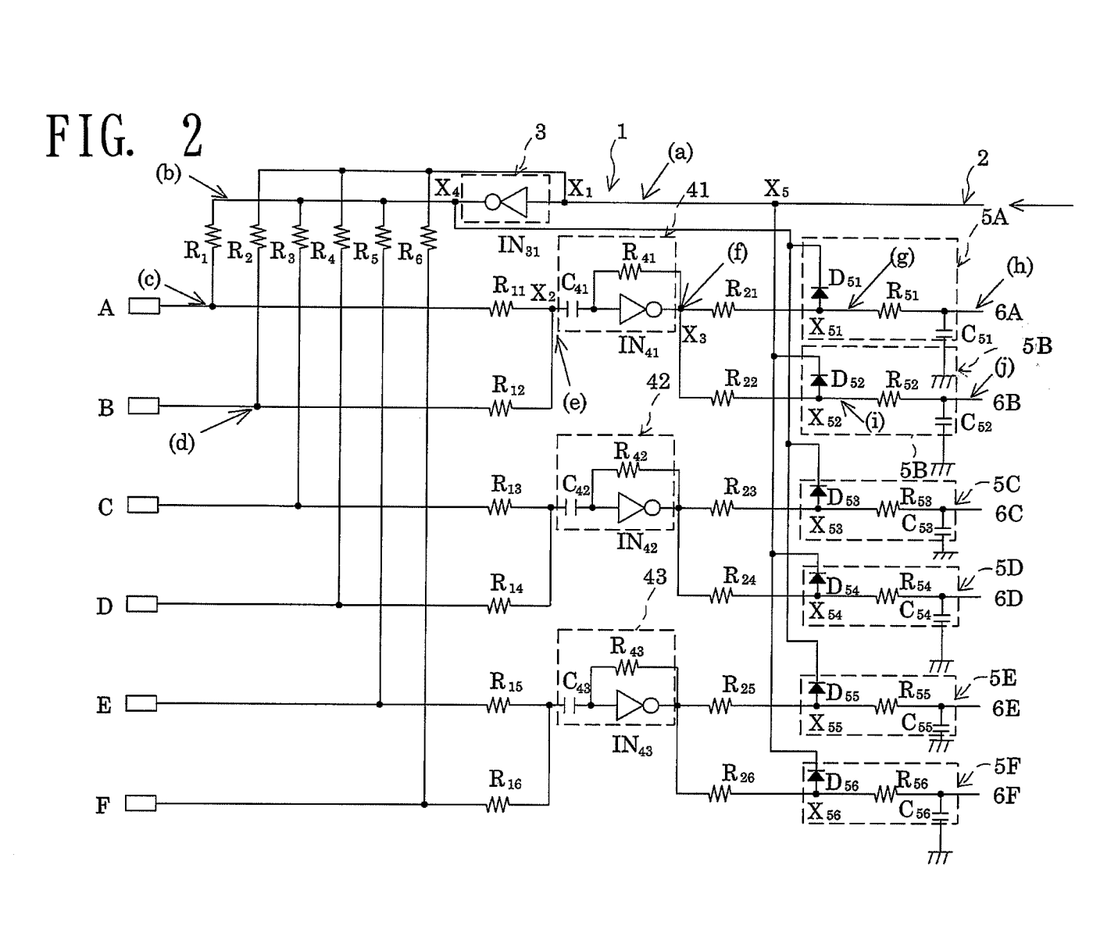
FIG. 2 is a circuit diagram for illustrating the capacitance change detection circuit of the present invention.

A detailed explanation for this detection circuit 1 will be offered using FIG. 2. FIG. 2 is a circuit diagram for showing the concrete configuration of the above-described capacitance change detection circuit. In FIG. 2, the same constituent elements as those in FIGS. 1(a), 1(b) are assigned the same reference numerals or symbols as those in FIGS. 1(a), 1(b).

FIG. 2 shows three sets of electrodes, namely, a case where the number of the electrodes is set at 6, for example, with all the respective electrodes A to F being the same.

The circuit configuration will be described merely by reference to the electrodes A and B.

The input unit 2 is connected to the electrode A and, between the electrode A and the input unit 2, the one phase inversion means 3 and a resistor $R_1$ are connected in this sequence from the side of the input unit 2. The phase inversion means 3 is designed to invert the phase of the inputted signal, and comprises, for example, an inverter $IN_{31}$ of C-MOS. The inverter $IN_{31}$ has the input side connected to the input unit 2, and has the output side connected to the resistor $R_1$.

The input unit 2 is also connected to the electrode B only via a resistor $R_2$ by way of the connection point $X_1$ located between the input unit 2 and the phase inversion means 3. That is, the electrode A and the electrode B are configured to receive signals having phases shifted from each other by a half period.

Furthermore, a resistor $R_{11}$ is connected to the electrode A, and a resistor $R_{12}$ is connected to the electrode B. The resistor $R_{11}$ is connected to the input side of the one amplification means 41, and the resistor $R_{12}$ is connected to the input side of the amplification means 41 by way of the connection point $X_2$ located between the resistor $R_{11}$ and the input side of the one amplification means 41. At this connection point $X_2$, the signal showing the state of the electrode A and the signal showing the state of the electrode B are combined, and the resulting composite signal is inputted to the one amplification means 41.

The amplification means 41 comprises a capacitor $C_{41}$, an inverter $IN_{41}$, and a resistor $R_{41}$. The capacitor $C_{41}$ is connected to the connection point $X_2$ and the input side of the inverter $IN_{41}$, and the resistor $R_{41}$ is connected in parallel with the inverter $IN_{41}$. The inverter $IN_{41}$ and the resistor $R_{41}$ constitute a negative feedback inverting amplification circuit. Because of such a configuration, the signal inputted to the amplification means 41 has its phase inverted and has its amplitude amplified to be outputted.

The output side of the amplification means 41 is connected to the two detection means 5A and 5B by way of the connection point $X_3$ located on the output side. Thus, the signal outputted from the amplification means 41 is branched again at the connection point $X_3$ to be inputted to the respective detection means 5A and 5B. A resistor $R_{21}$ is connected between the amplification means 41 and the detection means 5A, while a resistor $R_{22}$ is connected between the amplification means 41 and the detection means 5B.

At the respective detection means 5A and 5B, the signals showing the states of the respective electrodes A and B are detected from the one signal outputted from the amplification means 41. For this purpose, the detection means 5A and 5B are configured such that the detection means 5A will receive a signal for counteracting the signal showing the state in the electrode B of a phase opposite to the phase of the signal supplied to the electrode A, whereas the detection means 5B will receive a signal for counteracting the signal showing the state of the electrode A of a phase opposite to the phase of the signal supplied to the electrode B. That is, the detection means 5A is configured to be capable of detecting only the signal showing the state of the electrode A, whereas the detection means 5B is configured to be capable of detecting only the signal showing the state of the electrode B. As described above, the detection means are designed to withdraw the signals at the respective electrodes. Thus, the number of the detection means agrees with the number of the electrodes.

Specifically, the detection means 5A comprises a diode $D_{51}$, a resistor $R_{51}$, and a capacitor $C_{51}$. The resistor $R_{51}$ is connected to the resistor $R_{21}$. The diode $D_{51}$ has the anode side connected to a connection point $X_{51}$ located between the resistor $R_{51}$ and the resistor $R_{21}$, and has the cathode side connected to a connection point $X_4$ provided on the output side of the phase inversion means 3. The capacitor $C_{51}$ and the resistor $R_{51}$ constitute a smoothing circuit.

In the so constructed detection means 5A, a signal of the same phase as the phase of the signal supplied to the electrode A is supplied via the diode $D_{51}$. Of this signal, only a signal of a low voltage portion is combined at the connection point $X_{51}$ with the signal outputted from the amplification means 41. This signal of the low voltage portion is of a phase opposite to the phase of the signal showing the state of the electrode B. Thus, of the signal outputted from the amplification means 41, the signal showing the state of the electrode B is canceled out by this signal component. That is, this signal of the low voltage portion is the signal for counteracting the signal showing the state of the electrode B. Because of this signal, only the signal showing the state of the electrode A can be withdrawn at the detection means 5A. This withdrawn signal is smoothed by the resistor $R_{51}$ and the capacitor $C_{51}$, and the amplitude at the electrode A is detected.

The detection means 5B, concretely, comprises a diode $D_{52}$, a resistor $R_{52}$, and a capacitor $C_{52}$. The resistor $R_{52}$ is connected to the resistor $R_{22}$. The diode $D_{52}$ has the anode side connected to a connection point $X_{52}$ located between the resistor $R_{52}$ and the resistor $R_{22}$, and has the cathode side connected to a connection point $X_5$ provided between the input unit 2 and the connection point $X_1$. The capacitor $C_{52}$ and the resistor $R_{52}$ constitute a smoothing circuit.

In the so constructed detection means 5B, a signal of the same phase as the phase of the signal supplied to the electrode B is supplied via the diode $D_{52}$. Of this signal, only a signal of a low voltage portion is combined at the connection point $X_{52}$ with the signal outputted from the amplification means 41. The signal of the low voltage portion is shifted by a half period from the phase of the signal showing the state of the electrode A. Thus, of the signal outputted from the amplification means 41, the signal showing the state of the electrode A is canceled out by the signal of the low voltage portion. That is, this signal of the low voltage portion is the signal for counteracting the signal showing the state of the electrode A. Because of this signal, only the signal showing the state of the electrode B can be withdrawn at the detection means 5B. This withdrawn signal is smoothed by the resistor $R_{52}$ and the capacitor $C_{52}$, and the amplitude at the electrode B is detected.

The output sides of the detection means 5A, 5B are connected to the output units 6A, 6B, respectively. The output units 6A, 6B are configured to be capable of comparing the signals outputted from the detection means 5A, 5B with a reference signal. When the same signal as the reference signal is inputted to the output units 6A, 6B, a determination of no contact is made. When signals different from the reference signal are inputted, it is determined that contact has been made. Here, the reference signal is the same signal as the signal inputted from the detection means 5A, 5B to the output units 6A, 6B when no contacts with the electrodes A and B are made.

The above explanations are limited to the electrodes A and B, but the electrodes C and D, and the electrodes E and F are also configured in the same manner as for the electrodes A and B.

The electrode C and the electrode D in parallel with the electrode C will be described briefly. The input unit 2 is connected to the electrode C via the phase inversion means 3 and a resistor $R_3$, and the input unit 2 is connected to the electrode D via a resistor $R_4$. The electrodes C and D are connected to the input side of one amplification means 42 via resistors $R_{13}$ and $R_{14}$, respectively. The amplification means 42 comprises a capacitor $C_{42}$ a resistor $R_{42}$ and an inverter $IN_{42}$, and is of the same configuration as that of the amplification means 41. To the output side of the amplification means 42, a resistor $R_{23}$ and the input side of a detection means 5C are connected, and a resistor $R_{24}$ and the input side of a detection means 5D are also connected. The output sides of the detection means 5C and 5D are connected to output units 6C and 6D, respectively. The detection means 5C comprises a diode $D_{53}$, a resistor $R_{53}$, and a capacitor $C_{53}$, and is of the same configuration as that of the detection means 5A. The detection means 5D comprises a diode $D_{54}$, a resistor $R_{54}$, and a capacitor $C_{54}$ and is of the same configuration as that of the detection means 5B.

The electrode E and the electrode F in parallel with the electrode E will be described briefly. The input unit 2 is connected to the electrode E via the phase inversion means 3 and a resistor $R_5$, and the input unit 2 is connected to the electrode D via a resistor $R_6$. The electrodes E and F are connected to the input side of one amplification means 43 via resistors $R_{15}$ and $R_{16}$, respectively. The amplification means 43 comprises a capacitor $C_{43}$, a resistor $R_{43}$, and an inverter $IN_{43}$, and is of the same configuration as that of the amplification means 41. To the output side of the amplification means 43, a resistor $R_{25}$ and the input side of a detection means 5E are connected, and a resistor $R_{26}$ and the input side of a detection means 5F are also connected. The output sides of the detection means 5E and 5F are connected to output units 6E and 6F, respectively. The detection means 5E comprises a diode $D_{55}$, a resistor $R_{55}$, and a capacitor $C_{55}$, and is of the same configuration as that of the detection means 5A. The detection means 5F comprises a diode $D_{56}$, a resistor $R_{56}$, and a capacitor $C_{56}$, and is of the same configuration as that of the detection means 5B.

Figure 3:
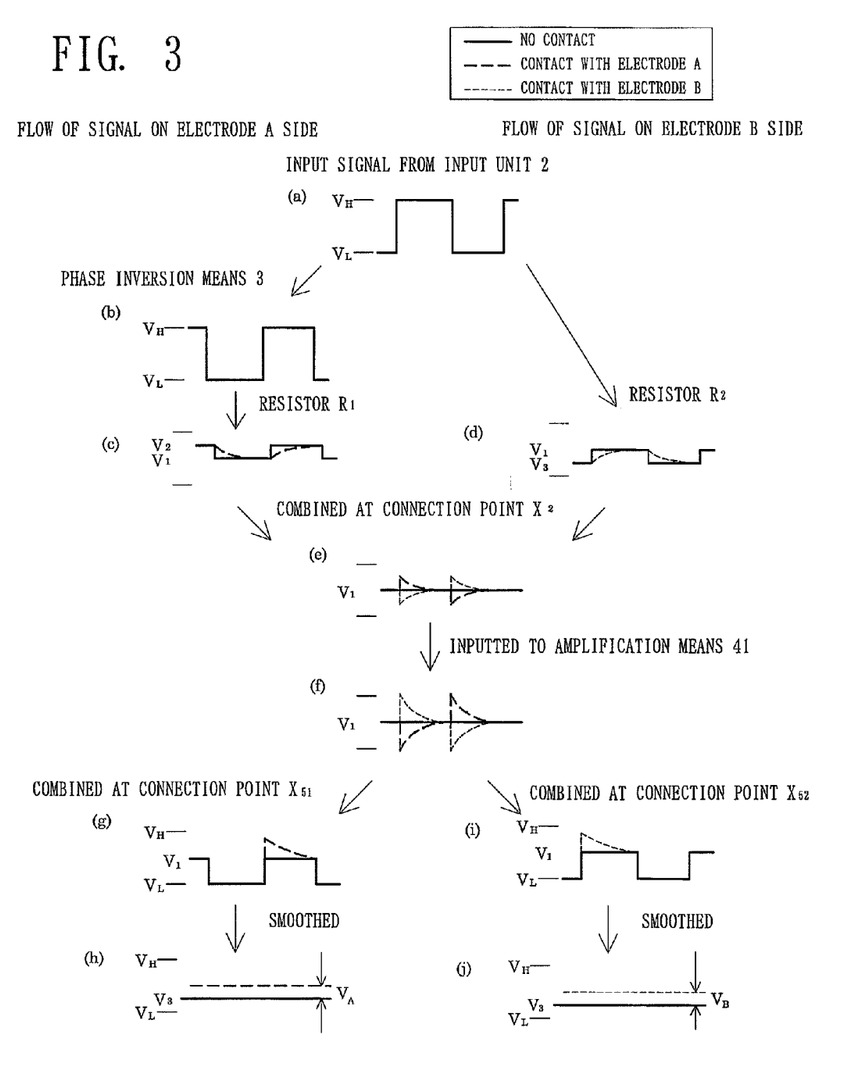

The actions of the capacitance change detection circuit 1 shown in FIG. 2 will be described using FIGS. 3(*a*) to 3(*j*), the descriptions being limited to the electrodes A and B. FIGS. 3(*a*) to 3(*j*) are graphs showing the waveforms of the signals at positions (a) to (j) in FIG. 2.

First, the actions in the absence of contact in any of the electrodes will be described. Initial rectangular pulses inputted from the input unit 2 have an amplitude with a maximum value of $V_H$ and a minimum value of $V_L$ (see FIG. 3(*a*)). This input signal is branched at the connection point $X_1$, whereafter one of the branched signals is inputted to the inverter $IN_{31}$ as the phase inversion means 3, and is delayed by a half period at the inverter $IN_{31}$ (see FIG. 3(*b*)). Then, the delayed signal is supplied to the electrode A via the resistor $R_1$. Thus, the amplitude of the rectangular pulses is compressed to $V_2$-$V_1$ (see the signal indicated by a solid line in FIG. 3(c)). On the other hand, the input signal branched off at the connection point $X_1$ is supplied to the electrode B via the resistor $R_2$, so that the amplitude of the rectangular pulses is compressed to $V_1$-$V_3$ (see the signal indicated by a solid line in FIG. 3(d)). Here, the values of the resistors $R_1$ and $R_2$ are set such that the respective voltages meet the relationships $V_1=(V_H+V_L)/2$, $V_2=3(V_H+V_L)/4$, and $V_3=(V_H+V_L)/4$, and preferably, the values of the resistor $R_1$ and the resistor $R_2$ are the same.

Then, the signals supplied to the respective electrodes A and B are combined at the connection point $X_2$. Since these signals have their phases inverted with respect to each other, the resulting composite signal becomes constant at the voltage $V_1$ (constant voltage), as indicated by a solid line in FIG. 3(e). The composite signal has no amplitude and, even when inputted to the amplification means 41, becomes constant at the voltage $V_1$, without changing from the voltage at the position (e) (see FIG. 3(f)).

Then, the signal is inputted to the detection means 5A, 5B. The actions of the detection means 5A will be described first. At the connection point $X_{51}$ of the detection means 5A, the signal which has been inputted from the input unit 2, passed through the inverter $IN_{31}$ for phase inversion, and then supplied via the diode $D_{51}$ and which consists only of a voltage $V_L$ portion, and the signal outputted from the amplification means 41 (see FIG. 3(f)) are combined. Upon combination, the signal showing the state of the electrode B is canceled from the signal outputted from the amplification means 41, whereby only the signal showing the state of the electrode A is withdrawn. At the position (g), therefore, a rectangular pulse-shaped signal having an amplitude $V_L$-$V_1$ shown in FIG. 3(g) and having the same period as that of the signal supplied to the electrode A is obtained.

When this signal is smoothed by the resistor $R_{51}$ and the capacitor $C_{51}$, a constant voltage constant at the voltage $V_3$ is detected (see FIG. 3(h)). In this case, only the same voltage as the reference voltage is inputted to the output unit 6A. Thus, it is determined that no contact with the electrode A has been made.

In the detection means 5B, the signal outputted from the amplification means 41, and the signal which consists only of the voltage $V_L$ portion and which has been supplied via the diode $D_{52}$ after entry of the input signal (see FIG. 3(b)) are combined at the connection point $X_{52}$. At the position (i), therefore, a rectangular pulse-shaped signal having an amplitude $V_L$-$V_1$ shown in FIG. 3(i) is obtained.

When this signal is smoothed by the resistor $R_{52}$ and the capacitor $C_{52}$, a constant voltage constant at the voltage $V_3$ is detected (see FIG. 3(j)). In this case, only the same voltage as the reference voltage is inputted to the output unit 6B. Thus, it is determined that no contact with the electrode B has been made.

A case where a human touches or contacts the electrode A or B will be described.

In the presence of human contact with the electrode A or B, the same state as the connection of the capacitor C with the electrode is achieved, as shown in FIG. 1(b). As a result, an electric current flows in this capacitor C, and then the voltage is saturated. Thus, the waveforms of the input signals at the electrodes A and B become nonrectangular pulse-shaped signals, as indicated by dashed lines in FIGS. 3(c) and 3(d).

When the signals of the shapes indicated by the dashed lines in FIGS. 3(c) and 3(d) are combined at the connection point $X_2$, a nonrectangular pulse-shaped signal having an amplitude with values varying upward and downward from the voltage $V_1$ as the center is formed, as indicated by dashed lines in FIG. 3(e).

When the resulting composite signal indicated by the dashed lines in FIG. 3(e) is inputted to the amplification means 41, it has a phase inverted and an amplitude amplified, becoming a signal having the amplitude $V_L$-$V_H$ centered about the voltage $V_1$ (see dashed-line portions in FIG. 3(f)). Then, the amplified signal is branched at the connection point $X_3$, and the resulting branched-off signals are inputted to the detection means 5A and 5B via the resistors $R_{21}$ and $R_{22}$.

The actions of the detection means 5A in the presence of contact with the electrode A will be described. At the connection point $X_{51}$, the signal, which has been obtained from the initial input signal passed through the inverter $IN_{31}$ for phase inversion, followed by passage via the diode $D_{51}$, and which consists only of the voltage $V_L$ portion, and the signal outputted from the amplification means 41 are combined. Consequently, the signal showing the state of the electrode B of the phase opposite to the phase of the signal at the electrode A is counteracted by the signal consisting only of the voltage $V_L$ portion. At the position (g), there appears only the signal showing the state of the electrode A having a larger amplitude by an amplified signal quantity than when no contact has been made, as shown by the dashed line in FIG. 3(g).

When this signal is smoothed by the capacitor $C_{51}$, the constant voltage $(V_3+V_A)$ higher than the voltage $V_3$ by the amplified signal quantity is detected (see FIG. 3(h)). As a result, the voltage higher than the reference voltage $(V_3)$ by $V_A$ is inputted to the output unit 6A. Thus, it is determined that contact with the electrode A has been made.

The actions of the detection means 5B in the presence of contact with the electrode B will be described. At the connection point $X_{52}$, the signal outputted from the amplification means 41, and the signal, which has been obtained from the initial input signal inputted via the diode $D_{51}$ and which consists only of the voltage $V_L$ portion, are combined. Of the signal outputted from the amplification means 41, the signal showing the state of the electrode A of the phase opposite to the phase of the signal supplied to the electrode B is counteracted by the signal consisting only of the voltage $V_L$ portion. At the position (i), there is obtained the signal showing the state of the electrode B of the waveform indicated by the dashed line in FIG. 3(i). When this waveform is smoothed by the capacitor $C_{52}$, the constant voltage $(V_3+V_B)$ higher than the voltage $V_3$ by the amplified signal quantity is detected (see FIG. 3(j)). Consequently, the voltage higher than the reference voltage $(V_3)$ by $V_B$ is outputted to the output unit 6B. Thus, it is determined that contact with the electrode B has been made.

The above descriptions have been limited to the electrodes A and B, but the electrodes C and D, and the electrodes E and F also exhibit the same actions.

With the detection circuit 1, as described above, the signals to be supplied to the two electrodes are phase-shifted with respect to each other by a half period by the phase inversion means 3, and then combined. In the absence of contact, the amplitude of the input pulses is eliminated. In the presence of contact, the amplitude of the input pulses is amplified by the one amplification means 41. The detection means 5A, 5B withdraw only the signals showing the states of the respective electrodes. Then, the output units 6A, 6B judge whether the voltages higher by an amplification of the input pulses, that is, higher by $V_A$ or $V_B$ than the reference voltage $V_3$, have been detected. Based on this judgment, capacitance changes at the contact electrodes A and B can be independently detected, and determination can be made.

Consequently, the detection circuit 1 of the present invention can detect the presence or absence of contact with the electrode, by relying on a very simple configuration in which the one amplification means and the two detection means are provided for the two electrodes.

With the present capacitance change detection circuit 1, each means does not use a transistor itself, but is composed of the inverter, the resistor, the capacitor, and the diode alone.

With the present capacitance change detection circuit 1, moreover, it can be logically determined whether contact is present or not depending on which of two voltage levels is outputted at the output units 6A to 6F, namely, the same voltage as the reference voltage, or a higher voltage than the reference voltage, as in a digital circuit. Thus, the present capacitance change detection circuit 1 has the advantage of few malfunctions.

With the above detection circuit 1, it is preferred that the values of the resistors $R_1$ to $R_6$ be all the same. It is also preferred that the values of $R_{11}$ to $R_{16}$ be all the same, and that the values of $R_{21}$ to $R_{26}$ be also the same. It is further preferred that the values of $R_1$ to $R_6$ and $R_{11}$ to $R_{16}$ be also the same.

In FIG. 2, the electrodes A and B, the electrodes C and D, and the electrodes E and F are paired up and connected to each amplification means 41. However, a combination of the electrodes may be any combination which allows signals of different phases to be supplied to the electrodes.

Furthermore, if such an operation as to carry out simultaneous contact with two or more contact electrodes is required, for example, if such an operation as to simultaneously turn on the electrodes A and B as switches is required, the electrodes A and C, and the electrodes B and D may be configured to become a set of contact electrodes, respectively. That is, it is configured that the signal from the input unit 2 is branched at the connection point $X_1$, and inputted to the electrodes C and D, and the signal having a phase inverted by the phase inversion means 3 is inputted to the electrodes A and B. Then, it is configured that the signal showing the state of the electrode A and the signal showing the state of the electrode C are inputted to the amplification means 41, and the signal showing the state of the electrode B and the signal showing the state of the electrode D are inputted to the amplification means 42.

By so configuring the detection circuit, simultaneous contact can be detected. In this case, the same effect can be obtained, even if the arrangement of the electrodes A and B is changed. That is, if the contact electrodes A, C, B and D are arranged in this sequence in FIG. 2, the same effect as mentioned above can be obtained. If simultaneous contact with the electrodes A and B occurs in a case where such an operation as to perform simultaneous contact with two or more contact electrodes is not required, the combination, at the connection point $X_2$, of the signals showing the states of the respective electrodes results in a constant voltage. This is the same outcome as that in the absence of contact with the electrodes A and B. In this case, therefore, the resulting data may be detected, for example, as an input error, on the assumption that no contact has been made.

If the above-described present detection circuit 1 is used as a touch panel, for example, a touch panel as a switch for an audio product inside an automobile, only the electrodes are provided on the surface of a panel portion of the touch panel so that a human can touch or contact it, and the output units are connected to an audio control unit. The present detection circuit 1 is simple in configuration and facilitates integration, even if the number of the electrodes increases. Thus, the present detection circuit 1 is suitable for constructing a multi-input circuit such as a switch for an audio product. The respective electrodes may be provided, for example, at a position permitting indirect contact, such as on the rear surface of the panel portion or inside the touch panel, without being provided on the surface of the panel portion.

In the above-described embodiment, contacts at the contact electrodes have been detected in the respective detection means. However, the detection circuit 1 may be configured, for example, such that a voltage difference between the output units 6A and 6B is detected, and it may be determined, based on this voltage difference, whether contacts have been made at the contact electrodes A, B.

INDUSTRIAL APPLICABILITY

The present circuit can be used as a touch sensor inorganic EL sheets, touch panels (e.g., display panels of equipment and switches for audio products installed on automobiles), etc. Thus, the present circuit can be utilized in the field of industrial equipment.

The invention claimed is:

1. A capacitance change detection circuit, comprising:
   at least one set of contact electrodes including a set of a first contact electrode supplied with a pulse signal from an input unit for the pulse signal via phase inversion means, and a second contact electrode supplied with the pulse signal from the input unit;
   a combining connection point that combines a first single output pulse output from the first contact electrode and a second single output pulse, corresponding to the first single output pulse, output from second contact electrode, and outputs a combined output;
   a single amplification means connected to the combining connection point for amplifying combined output from the combining connection point, the combining connection point being provided between the at least one set of contact electrodes and the single amplification means;
   first detection means for receiving the amplified combined output from the single amplification means and detecting a signal showing a state of the first contact electrode, the first detection means receiving the pulse signal via the phase inversion means to cancel signal indicative of a state of the second contact electrode;
   second detection means for receiving the combined output from the single amplification means and detecting a signal showing the state of the second contact electrode, the second detection means receiving the pulse signal from the input unit to cancel signal indicative of the state of the first contact electrode; and
   output units connected to the first detection means and the second detection means, respectively.

2. The capacitance change detection circuit according to claim 1, wherein
   the single amplification means comprises an inverter, a capacitor provided on an input side of the inverter, and a resistor in parallel with the inverter,
   an output side of the inverter is connected to input sides of the detection means, and
   the inverter and the resistor constitute a negative feedback inverting amplification circuit.

3. The capacitance change detection circuit according to claim 1, wherein
   the phase inversion means comprises an inverter.

4. The capacitance change detection circuit according to claim 1, wherein
   each of the first and second detection means comprises a diode, a resistor, and a capacitor,
   the diode of the first detection means has a cathode side connected to a first connection point supplied with the pulse signal from the phase inversion means, and has an anode side connected to a second connection point provided between an output side of the amplification means and the resistor of the first detection means, the diode of the second detection means has a cathode side connected to a third connection point supplied with the pulse signal from the input unit and has an anode side connected to a fourth connection point provided between the output side of the amplification means and the resistor of the second detection means, and the resistor and the capacitor of each of the detection means constitute a smoothing circuit.

5. The capacitance change detection circuit according to claim 1, wherein a first resistor is provided between the phase inversion means and the first contact electrode, a second resistor is provided between the input unit and the second contact electrode, and the first resistor and the second resistor have an equal resistance value.

6. The capacitance change detection circuit according to claim 1, wherein a third resistor is provided between the first contact electrode and the amplification means, a fourth resistor is provided between the second contact electrode and the amplification means, and the third resistor and e fourth resistor have an equal resistance value.

7. The capacitance change detection circuit according to claim 6, wherein the first resistor, the second resistor, the third resistor, and the fourth resistor have an equal resistance value.

8. The capacitance change detection circuit according to claim 1, wherein a fifth resistor is provided between the amplification means and the first detection means, a sixth resistor is provided between the amplification means and the second detection means, and the fifth resistor and the sixth resistor have an equal resistance value.

9. A touch panel, comprising:

the capacitance change detection circuit according to claim 1;

a panel portion; and a control unit, and wherein the contact electrodes of the capacitance change detection circuit are provided in the panel portion, and the output units of the capacitance change detection circuit are connected to the control unit.

10. A method of determining whether or not there is contact with a contact electrode, comprising:

providing the capacitance change detection circuit according to claim 1;

detecting a signal showing a difference between a signal showing a state of a first contact electrode and a signal showing a state of a second contact electrode; and determining, based on the signal showing the difference, whether or not there is contact with any of the contact electrodes.

11. A capacitance change detection circuit, comprising:

at least one set of contact electrodes including a set of a first contact electrode supplied with a pulse signal from an input unit for the pulse signal via phase inversion means, and a second contact electrode supplied with the pulse signal from the input unit;

one amplification means connected to the one set of contact electrodes;

first detection means for detecting a signal showing a state of the first contact electrode;

second detection means for detecting a signal showing a state of the second contact electrode; and output units connected to the first detection means and the second detection means, respectively, wherein each of the first and second detection means comprises a diode, a resistor, and a capacitor, the diode of the first detection means has a cathode side connected to a first connection point supplied with the pulse signal from the phase inversion means, and has an anode side connected to a second connection point provided between an output side of the amplification means and the resistor of the first detection means, the diode of the second detection means has a cathode side connected to a third connection point supplied with the pulse signal from the input unit, and has an anode side connected to a fourth connection point provided between the output side of the amplification means and the resistor of the second detection means, and the resistor and the capacitor of each of the detection means constitute a smoothing circuit.

* * * * *